(12) United States Patent
Heinen

(10) Patent No.: US 6,251,767 B1
(45) Date of Patent: Jun. 26, 2001

(54) BALL GRID ASSEMBLY WITH SOLDER COLUMNS

(75) Inventor: Katherine G. Heinen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/324,844

(22) Filed: Jun. 3, 1999

Related U.S. Application Data

(62) Division of application No. 08/782,872, filed on Jan. 14, 1997.

(51) Int. Cl.[7] .................................................. H01L 21/44
(52) U.S. Cl. ......................... 438/616; 438/119; 438/612; 438/61.3; 228/180.21; 228/180.22
(58) Field of Search ................................... 438/119, 612, 438/613, 616; 228/180.21, 180.22

(56) References Cited

U.S. PATENT DOCUMENTS 3,986,255 * 10/1976 Mandal .................................. 29/626
6,057,168 * 5/2000 Seyama et al. ....................... 438/616
6,142,361 * 11/2000 Downes et al. .................... 228/173.1

\* cited by examiner

Primary Examiner—John F. Niebling
Assistant Examiner—David Zarneke
(74) Attorney, Agent, or Firm—Wade James Brady, III; Frederick J. Telecky, Jr.

(57) ABSTRACT

A method of making a ball grid assembly and the assembly wherein a mask (1) is provided which is not wettable by solder and through which a pattern of parallel holes (3) is provided extending to at least one of a pair of opposing surfaces. A magnet (5), preferably an electromagnet, is disposed at the other one of the opposing surfaces. Solderable magnetic pins (7) are caused to enter the holes by magnetic attraction by positioning the one surface of the mask over the pins with a portion of each of the pins extending out of the hole into which it has entered. A layer of solder (11) is formed on the portion of each of the pins extending out of a hole in the mask and this layer of solder is reflowed over the pins and over a grid of solder adherable elements (13) on the package (15) and then allowed to set. The mask is removed from the pins when the solder is again set.

11 Claims, 1 Drawing Sheet

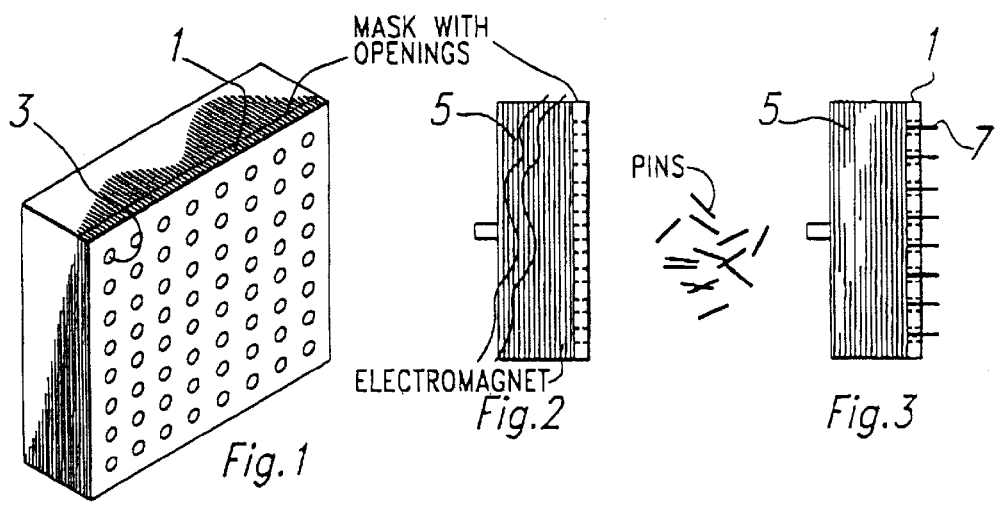
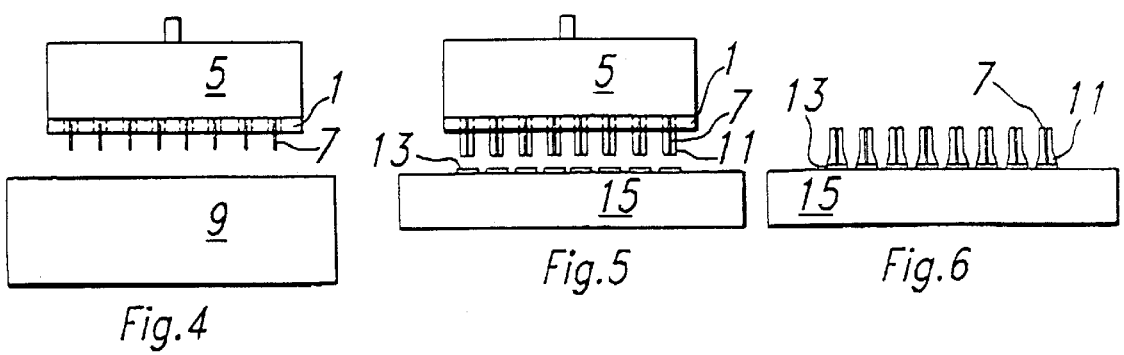

BALL GRID ASSEMBLY WITH SOLDER COLUMNS

This appln. is a Div. of Ser. No. 08/782,872 filed on Jan. 14, 1997.

BACKGROUND OF THE INVENTION

1. Field of the Invention

This invention relates to an automated solder ball grid assembly array and to a method of providing solder columns therein and the assembly.

2. Brief Description of the Prior Art

Typically, in accordance with the prior art, surface mounted electronic packages which are mounted on circuit boards have leads around the periphery of a surface of the package with the leads later being soldered to the board. Another type of packaging uses a pin grid array where the pins can be anywhere on a surface of the package rather than only at the perimeter, thereby permitting many more pins to be available in the same area as compared with the above described arrangement. A further type of prior art packaging is a ball grid array wherein an electronic package is provided with interconnect traces and solder balls thereon which are the means for connection. There is mismatch in such types of packaging between the printed circuit board which is typically FR-4 and the integrated circuit package which is ceramic, BT resin or filled epoxy novalac resin. Whereas leaded SMT packages have leads which can flex and absorb the mismatch, in ball grid array (BGA) the leads are rigid and the solder is subject to fatigue cracking. As the distance between mismatching materials (i.e., package and board) is increased, stress concentration is decreased within the material which connects the dissimilar materials. In order to compensate for some mismatch in thermal expansion between the electronic package, the printed circuit board and the solder ball connection of a package, it is desirable to make the connections as tall as possible to absorb some of the mismatch and stresses. Accordingly, the solder balls are sometimes replaced with solder columns to provide such tall connections as a column grid. Attachment of solder balls and/or solder columns is cumbersome and relatively costly with automation thereof being highly desirable.

SUMMARY OF THE INVENTION

In accordance with the present invention, there is provided an automated solder ball grid assembly array having solder columns and a method of providing the solder columns therein and the assembly itself which materially speeds up the prior art procedures and materially lowers the fabrication costs. The solder connections are made taller and the procedure for making the connections is improved relative to the prior art.

Briefly, the improvements are accomplished by providing an electromagnet whose surface is not a solderable material, this surface being covered by a mask with a pattern of holes. The mask is formed using the technology and materials for solder masks found in standard printed circuit board technology. The pattern of holes mirrors the pads on the ball grid assembly (BGA) package.

The mask is affixed onto the magnet, preferably an electromagnet, with the holes extending in the direction of the electromagnet. Solderable or solder plated magnetic pins, preferably of a steel alloy, such as, for example, A-42 coated with a solderable metal, such as, for example, copper, gold or palladium and the like are then provided, for example, in a box or deposited on a surface in some random manner. The mask with electromagnet on a side of the mask away from the pins is then brought into the vicinity of the pins so that the pins are attracted to the mask by the magnet and enter the holes in the mask. The mask is preferably designed relative to the length and diameter of the pins so that the hole diameter is larger than the pin but only one pin can fit into each hole of the mask and the pins will extend out of the holes in the mask. It is known that solder will coat a material with which it is compatible and make a thicker layer thereon. Accordingly, at least a portion of each of the pins extending out of the mask is dipped into molten solder and removed from the solder, the solder forming a coating over the pins at least at some or all of the portion of the pins extending out of the mask. Preferably the pins have been preplated with solder. This solder is then reflowed and travels along the associated pin as well as onto the pads of a package with contact pads thereon. This is accomplished by aligning the solder coated pins with the pads and heating the pads on the package sufficiently so that the pads will supply sufficient heat to cause some of the solder to reflow along the associated pin and onto the pads. The electromagnet is then turned off and removed along with the mask when the solder has hardened or set. The result is an electronic package having pins with solder coated on the exterior of the pins.

BRIEF DESCRIPTION OF THE DRAWINGS

FIG. 1 is a front view of a mask as used in accordance with the present invention;

FIG. 2 is a side view of the mask of FIG. 1 secured to an electromagnet;

FIG. 3 is a side view of the mask and electromagnet of FIG. 2 with pins loaded in the mask;

FIG. 4 is a front view of the mask, electromagnet and pins of FIG. 3 prior to coating of the pins with solder from a solder pot;

FIG. 5 is a front view as in FIG. 4 with the pins coated with solder and the pins aligned with solder balls of an electronic package having a solder ball grid array thereon; and FIG. 6 is a front view of the electronic package of FIG. 5 after attachment of the pins in FIG. 5 to the ball grid and removal of the mask and electromagnet.

DESCRIPTION OF THE PREFERRED EMBODIMENT

Referring first to FIG. 1, there is shown a mask 1 typically photo-formed of an acrylic or other polymer having holes 3 extending entirely therethrough. The pattern of the mask mirrors the pads in a BGA type electronic package. The holes 3 have a diameter such that only one pin, as described hereinbelow, can fit in a hole 3 at one time. The mask 1 is affixed onto an electromagnet 5 with the holes 3 extending to the electromagnet as shown in FIG. 2 (it is not essential that these holes extend entirely through the mask to the electromagnet). Solderable or solder coated magnetic pins 7 of, for example, alloy 42 are then provided in a box or container in some random manner and the mask 1 with electromagnet 5 on the side of the mask away from the pins 7 is then brought into the vicinity of the pins so that the pins are attracted to the mask by the magnet and enter the holes 3 in the mask as shown in FIG. 3. The pins 7 are sized so that only one pin can fit in each hole of the mask 1 at one time and the pins will extend out of the holes 3 in the mask. A portion of each of the pins 7 extends out of the mask 1 and all or a part of these portions of the pins that extend out of the mask are dipped into molten solder in a solder pot 9 as shown in FIG. 4 and removed from the solder pot. Alternately, the pins could be solder coated or plated before pick up by the magnet to eliminate this step. The solder forms a solder coating 11 over the pins 7 as shown in FIG. 5. The solder 11 coated pins 7 are then aligned with the solder pads or lands 13 of an electronic package 15 as shown in FIG. 5. This solder 11 on the pins 7 is then reflowed along the associated pin and onto the solder pads 13 of the package 15 by aligning the solder coated pins 7, 11 with the pads balls 13 and heating the package 15 to supply sufficient heat to cause some of the solder 11 to reflow onto the solder pads as shown in FIG. 6. The temperature of the package is then reduced to allow the solder to set. The electromagnet 5 is then turned off and removed along with the mask 1 when the solder 11 has hardened or set. The result is an electronic package having pins with solder coated on the exterior of the pins in the form of columns as shown in FIG. 6.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of making a ball grid assembly comprising the steps of:
   (a) providing a mask which is not wettable by a solder to be used in conjunction therewith and through which a pattern of parallel holes is provided extending to at least one of a pair of opposing surfaces with a magnet disposed at the other of said opposing surfaces;
   (b) providing one of solderable or solder-coated magnetic pins;
   (c) causing said pins to enter said holes by magnetic attraction by positioning said one surface over said pins with a portion of each of said pins extending out of the hole into which it has entered;
   (d) forming a layer of solder on the portion of each of said pins extending out of a said hole;
   (e) causing said layer of solder to reflow over said pins and over a grid of solder adherable elements and then set; and
   (f) removing said pins from said mask.

2. The method of claim 1 wherein said grid is a plurality of solder pads disposed on a package.

3. The method of claim 1 wherein said magnet is an electromagnet.

4. The method of claim 2 wherein said magnet is an electromagnet.

5. The method of claim 1 wherein said solderable magnetic pins have a magnetizable core which is coated with a solderable metal.

6. The method of claim 4 wherein said solderable magnetic pins have a magnetizable core which is coated with a solderable metal.

7. The method of claim 1 wherein said solderable magnetic pins are a core of an alloy of steel coated with a material taken from the class consisting of copper, gold or palladium.

8. The method of claim 4 wherein said solderable magnetic pins are taken from the class consisting of an alloy of steel coated with a material taken from the class consisting of copper, gold or palladium.

9. A method of making a ball grid assembly comprising the steps of:
   (a) providing a mask which is not wettable by a solder to be used in conjunction therewith and through which a pattern of parallel holes is provided extending to at least one of a pair of opposing surfaces with a magnet disposed at the other of said opposing surfaces;
   (b) providing solderable pins;
   (c) causing said pins to enter said holes with a portion of each of said pins extending out of the hole into which it has entered;
   (d) forming a layer of solder on the portion of each of said pins extending out of a said hole;
   (e) causing said layer of solder to reflow over said pins and over a grid of solder adherable elements and then set; and
   (f) removing said pins from said mask.

10. The method of claim 9 wherein said solderable pins are taken from the class consisting of a magnetizable core coated with a solderable metal.

11. The method of claim 9 wherein said solderable pins are taken from the class consisting of a core of an alloy of steel coated with a solderable metal taken from the class consisting of gold, copper or palladium.

* * * * *